United States Patent [19]

Tzeng

[11] Patent Number: 4,599,525

[45] Date of Patent: Jul. 8, 1986

[54] DE-GLITCH CIRCUITRY FOR VIDEO GAME MEMORIES

[75] Inventor: Chin-Pyng J. Tzeng, Albany, Calif.

[73] Assignee: Rockwell International Corporation, El Segundo, Calif.

[21] Appl. No.: 463,093

[22] Filed: Feb. 2, 1983

[51] Int. Cl.$^4$ .................. H03K 17/16; H03K 17/284
[52] U.S. Cl. ................................... 307/234; 307/530; 307/543; 307/568; 307/574
[58] Field of Search ............... 307/234, 246, 530, 543, 307/567, 568, 574

[56] References Cited

U.S. PATENT DOCUMENTS

| | | | |
|---|---|---|---|
| 3,138,759 | 6/1964 | Thompson | 307/234 |
| 3,277,311 | 10/1966 | Merlen et al. | 307/234 |
| 3,906,379 | 9/1976 | Tuhro | 307/234 |
| 4,287,442 | 9/1981 | Spinks et al. | 307/246 |
| 4,368,515 | 1/1983 | Nielsen | 364/200 |
| 4,430,641 | 2/1984 | Baur et al. | 307/543 |

Primary Examiner—John S. Heyman
Attorney, Agent, or Firm—H. Fredrick Hamann; Randall G. Wick; David J. Arthur

[57] ABSTRACT

De-glitch circuitry selectively responds to the time duration of actuation signals for selecting between pages in a read only memory. The de-glitch circuitry uses MOSFET transistors to act as resistors and capacitors in order to provide an RC time constant. The RC time constant is selected to allow the de-glitch circuitry to eliminate spurious glitches and prevent unwanted segment selections in the memory. The de-glitch circuitry is used with a voltage reference generator, segment selection decoders, sense amplifiers, and a flip-flop; all of which are constructed of MOSFET transistors and incorporated in a read only memory integrated circuit chip. The de-glitch circuitry is particularly useful in the construction of program cartridges for video game computer systems.

14 Claims, 9 Drawing Figures

DE-GLITCH CIRCUITRY FOR VIDEO GAME MEMORIES

CROSS REFERENCE TO RELATED APPLICATIONS

U.S. Pat. No. 4,390,833, issued June 28, 1983, entitled "VOLTAGE REGULATOR CIRCUIT" was filed on May 22, 1981, assigned to Rockwell International Corporation, and listed C-P Jeremy Tzeng as sole inventor. The disclosure of that application is incorporated herein by reference.

FIELD OF THE INVENTION

This invention relates to signal discrimination switching circuitry for de-glitching or eliminating spurious signals in electronic circuitry, such as memory segment selection circuitry for electronic digital memories used in video game cartridges.

BACKGROUND OF THE INVENTION

Electronic amusement games have been made which use a digital computer to control a visible display, and which "play" a game in accordance with a game program stored in a read only memory. It is common to provide the game programs in the form of cartridges which have electrical connectors that may be readily plugged into the game computer. The cartridges contain read only memory devices which store game programs. This allows the same game computer to be used for a large number of different games. The game program for the game computer may be changed by unplugging one cartridge (the old game) and plugging in a different cartridge (the new game). It is common to sell game cartridges separately from a game computer so that the buyer may choose which games he or she wants to play and may buy only the cartridges he or she desires. This also allows the buyer to purchase additional cartridges after buying a game computer, so that the buyer may add to his selection of games. The use of cartridges also allows the manufacturer of electronic games to develop new games after introducing a game computer. For example, a supplier of video games for home use may begin producing cartridges for a game which has proven popular on coin-operated video game machines which are used in public arcades.

A problem for a manufacturer of cartridge-type video games is that it is relatively easy for unscrupulous competitors to produce unauthorized copies of cartridges. Extremely valuable game programming may be misappropriated by copying the stored program into counterfeit cartridges which may be fabricated using commonly available electronic components. The distribution of such unauthorized game program copies injures the game computer manufacturer and discourages the release of popular games on cartridges.

Another problem for a manufacturer of cartridge-type video games is that the design of a game computer and its cartridge electrical connector may place limitations on the size of a game program which may be placed in a cartridge. For example, the number of electrical conductors passing through the cartridge connector may limit the number of program addresses which are sent from the game computer to the cartridge. This limitation on addressing presents limitations on the length of game programs which may be placed in a cartridge. As the types of video games become more sophisticated and complex, the required program length increases. It may be very difficult to place new, challenging, intricate games into conventionally constructed game cartridges with program length constraints.

SUMMARY OF THE INVENTION

An object of the invention is to provide a method of switching between segments in a digital memory device, such as program storage memory used in electronic video game computers, with memory segment selection circuitry which substantially rejects noise glitches so that undesired selection of memory segments is prevented.

Another object of the invention is to provide de-glitch circuitry which allows rejection of noise glitches having a duration less than a predefined discrimination time.

The video game apparatus of this invention uses removable program storage cartridges which contain at least two separate read only memory segments. Segment selection circuitry is provided in the cartridge so that signals sent by the video game computer are used in order to select between the memory segments. The segment selection circuitry includes a signal discrimination circuit which prevents undesired or inadvertent segment selections by eliminating the effect of noise glitches which may be received by the cartridge from the video game computer. The signal discrimination circuit eliminates glitches which have a duration less than a discrimination time duration. The signal discrimination circuitry has a de-glitch circuit followed by a sense amplifier circuit so that the de-glitch circuit produces an increasing signal in response to signals from the program computer, and the sense amplifier detects when the de-glitch signal exceeds a switching signal level in order to control the selection between memory segments.

DESCRIPTION OF THE PREFERRED EMBODIMENT

Figure 1:
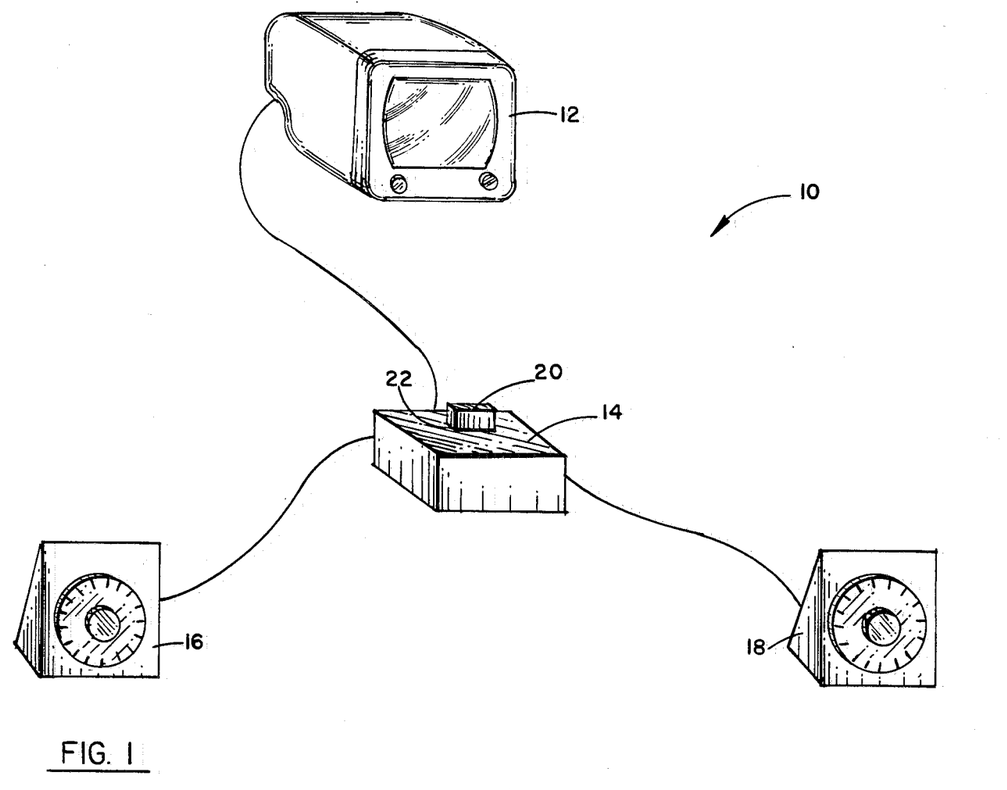
FIG. 1 is a perspective view of an electronic video game computer system.

Referring first to FIG. 1, a video game computer system 10 includes a television set 12, a video game computer 14, and user controls 16 and 18; all of which are interconnected with cabling. The user controls 16 and 18 may be paddles, joy sticks, or the like and their function is to allow one or more persons to play a video game in which operations of the controls 16 and 18 are used to control the display of images on the television set 12. The computer 14 and controls 16 and 18 are typically provided as a unit with cabling for connection to a standard television set 12.

A video game cartridge 20 is removably mounted in the computer 14 so that persons playing the game 10 may easily manually insert and remove video game cartridges (such as cartridge 20) from the slot 22 in the game computer 14 in order to change the type of video game being played.

Figure 2:
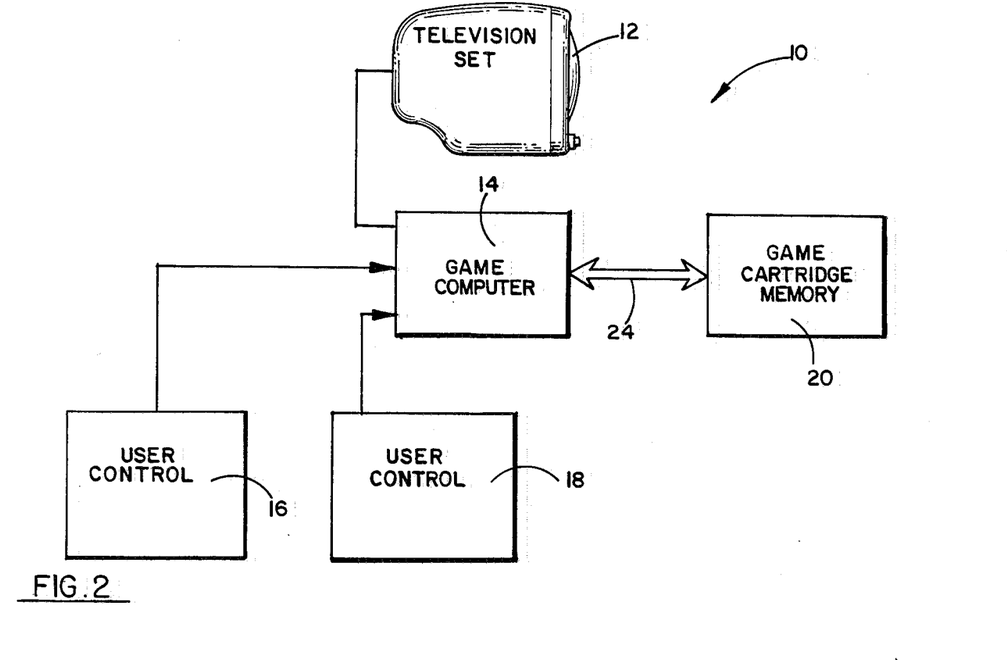
FIG. 2 is a block diagram of the electronic video game computer system of FIG. 1.

Referring next to FIG. 2, the user controls 16 and 18 are electrically connected to inputs of the game computer 14 so that circuitry inside the game computer 14 senses the manual actions of the persons playing the video game. The television set 12 is connected to an output of the game computer 14 so that the circuitry of the computer 14 may generate video images for presentation by the set 12. The game computer 14 may include any of a number of commercially available microprocessors or microcomputers which may be connected to conventional television sets (such as set 12) and conventional, commercially available paddles or joy sticks (such as user controls 16 and 18).

The game cartridge 20 includes semiconductor read only memory for storing a video game program. The game computer 14 accesses the video game program stored in the cartridge 20 through a bus 24. The bus 24 allows the computer 14 to address the contents of the cartridge memory 20, and to read program instructions from the memory 20. The video game program stored in the memory 20 is used by the computer 14 in order to generate and control the display of images on the television set 12.

The memory of the cartridge 20 is divided into segments and the computer 14 selects between the segments of the cartridge memory 20 by providing segment selection signals on the bus 24. The computer 14 also provides addressing signals on the bus 24 in order to address individual locations in the selected memory segment of the cartridge memory 20. The use of segment selection signals on the bus 24 allows the same set of address signals to be used for each segment of the cartridge memory 20. In practice, the computer 14 first selects the desired segment of cartridge memory 20 by providing the appropriate segment selection signal on the line 24. After this selection of the memory segment for cartridge 20 has been made, computer 14 produces the appropriate addressing signals on the bus 24 in order to read the desired memory locations from the cartridge memory 20.

Figure 3:
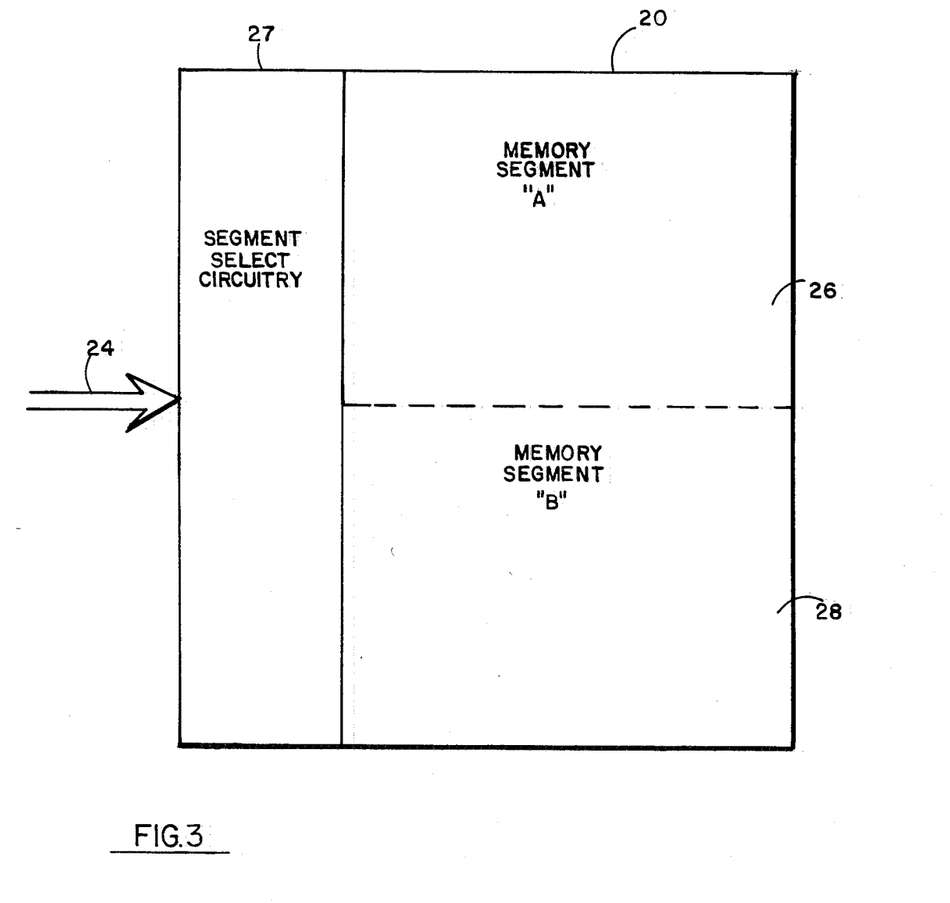
FIG. 3 is a block diagram of the memory cartridge used in the video game computer system of the invention.

Referring next to FIG. 3, the game cartridge memory 20 is divided into two segments, labeled segment A and B, and marked 26 and 28, respectively. The game computer 14 may be used to provide segment selection signals on the bus 24 (see FIG. 2) so that all address signals provided on the bus 24 cause reading to occur from the memory segment 26. Also, the computer 14 may be used to provide segment selection signals on the bus 24 so that all subsequent addressing signals on the bus 24 cause reading to occur from the memory segment 28. Segment select circuitry 27 responds to the segment select signals on the bus 24 and selectively enables either segment 26 or segment 28 so that subsequent addressing signals on the bus 24 will retrieve program instructions from the selected one of the segments 26 and 28. Therefore, the game computer 14 may select between the memory segments 26 and 28 so that when segment 26 is selected, the video game computer program portion stored in segment 26 may be read by the computer 14. Also, the video game computer program portion stored in segment 28 may be read by the computer 14 after the segment 28 is selected.

The construction of the game cartridge 20 allows a video game program which is too lengthy to be stored in segment 28 or 26 separately, to be divided so that a portion of the program is stored in segment 26 and the remainder of the program is stored in segment 28. For more lengthy video game programs, the memory cartridge 20 may be divided up into more than two segments. Also, segments 26 and 28 may be used to store more than one video game program. The use of segment select signals by cartridge 20 makes unauthorized duplication of the stored video program difficult. It is preferable that the segment select circuitry 27 and read only memory segments 26 and 28 be fabricated together on a single integrated circuit chip.

Figure 4A:
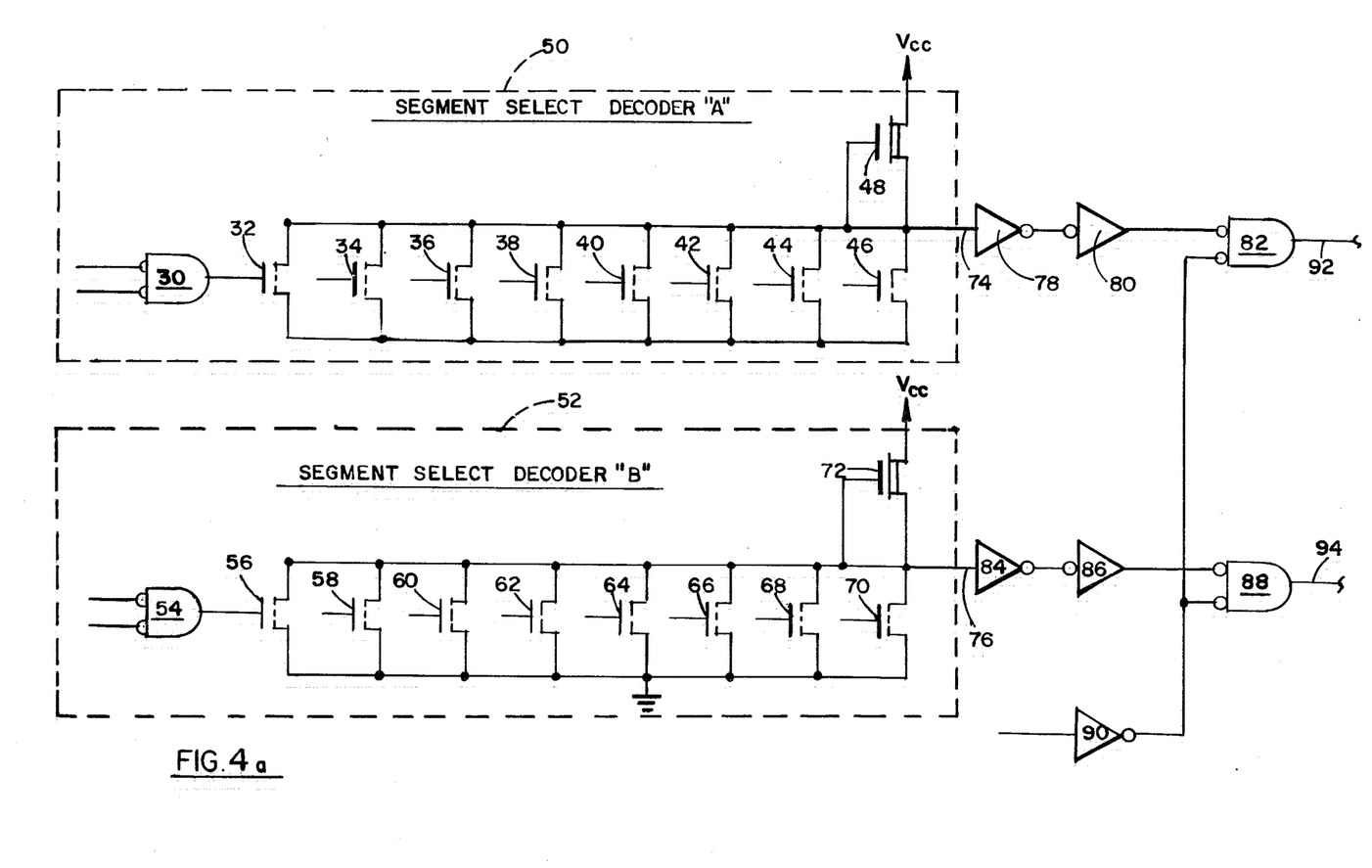
FIGS. 4a and 4b form a schematic diagram for the memory segment select circuitry of the invention.

Referring next to FIG. 4a, a portion of the electronic circuitry inside the game cartridge 20 which is used for selecting between the memory segments 26 and 28 is shown. A segment select decoder A (labeled 50) is connected to the bus 24 in order to respond to segment select signals produced by the computer 14. The function of decoder 50 is to produce an output on the line 74 when the computer 14 produces the appropriate segment select signal to select the memory segment 26 (see FIG. 3). The segment select signal produced by the computer 14 in order to select the memory segment 26 is in the form of a predefined address signal which is provided on the bus 24. Generally, address signals on the bus 24 access individual memory locations inside either segment 26 or 28. However, two of the addresses which may be provided on the bus 24 serve to separately actuate the decoders 50 and 52. That is, particular, predefined address signals on the bus 24 serve to separately actuate the decoders 50 and 52 in order to allow selection between the memory segments 26 and 28 and such predefined address signals serve as segment select signals.

The segment select decoder 50 includes a plurality of bit sensing transistors (32, 34, 36, 38, 40, 42, 44 and 46) which are coupled through appropriate buffer gates (such as gate 30) to the bus 24. The decoder 50 is constructed to sense the contents of an eight bit wide address bus and to produce an output indication on the line 74 when the particular predefined address (corresponding to selection of the memory segment 26) appears on the bus 24. The bit sensing transistors 32, 34, 36, 38, 40, 42, 44 and 46 are connected so that the transistor 48 is turned off only when the predefined address for selecting the segment 26 is present on the bus 24. The bit sensing transistors 32, 34, 36, 38, 40, 42, 44 and 46 are individually connected through appropriate inverters and buffers (not shown) to the eight address lines of the bus 24 in order to define the particular address which will be sensed by the decoder 50 in controlling the signal on line 74.

The segment select decoder B (labeled 52) is similar in construction to the decoder 50, except that decoder 52 responds to a predefined address on the bus 24 as a segment select signal in order to select the memory segment 28. The decoder 52 includes bit sensing transistors 56, 58, 60, 62, 64, 66, 68 and 70 as well as appropriate inverters and buffers (such as buffer 54) which are coupled to the address lines of the bus 24. The decoder 52 operates so that the transistor 72 is turned off only when the predefined address for selecting the memory segment 28 is present on the data bus 24. The decoder 52 produces an output signal on the line 76 in order to indicate that memory segment 28 is to be selected. The predefined address detected by decoder 52 is different from the predefined address detected by decoder 50 so that the two predefined addresses act as separate segment selection signals, thus allowing separate selection of either segment 26 or segment 28.

The output line 74 is connected through a pair of inverters 78 and 80 to an input of the gate 82. Similarly, the output line 76 is connected through inverters 84 and 86 to an input of the gate 88. An inverter 90 is connected to inputs of the gates 82 and 88 in order to allow the gates 82 and 88 to produce outputs on the lines 92 and 94, respectively, only when addressing signals are present on the bus 24.

Figure 4B:
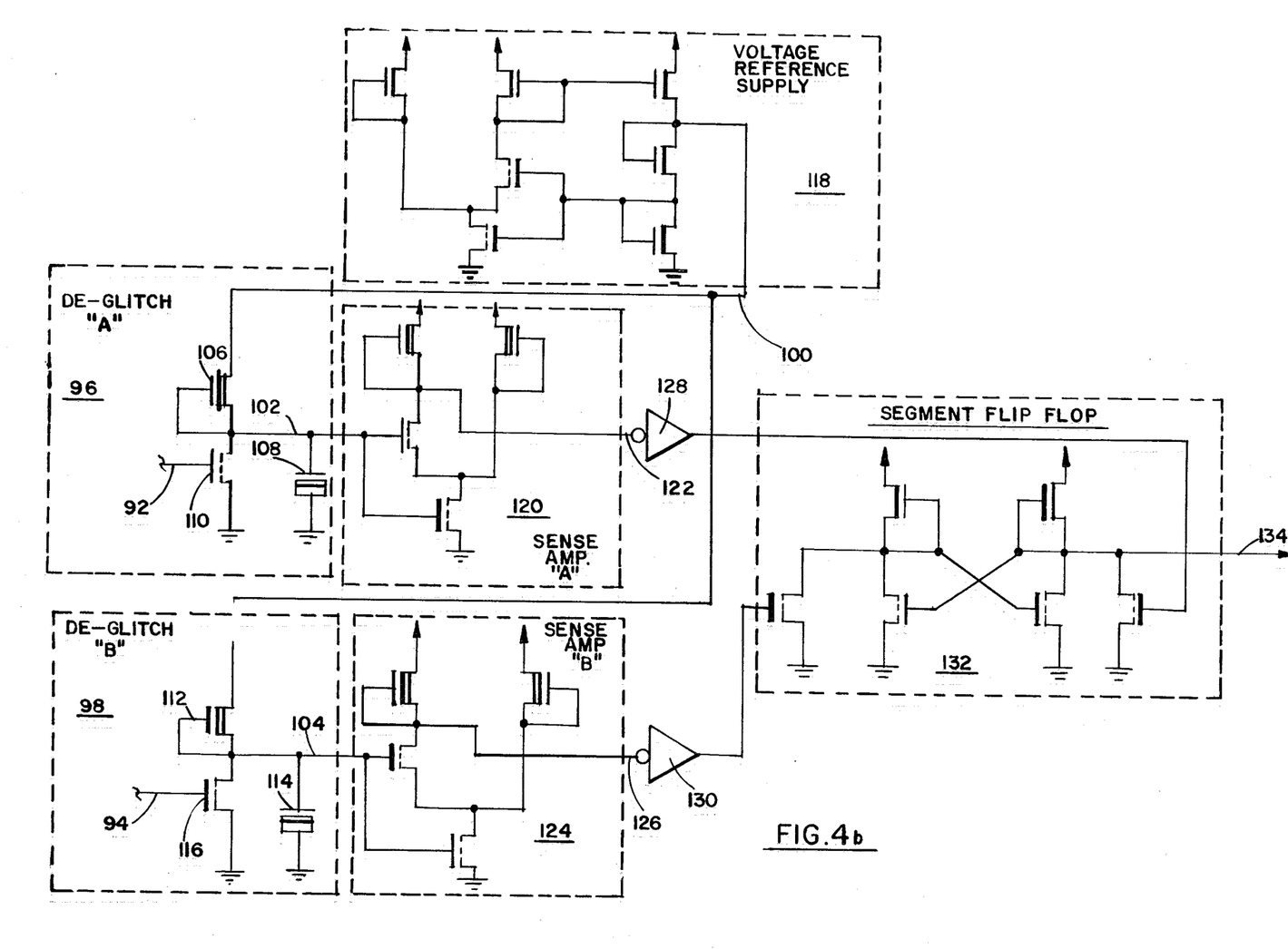

Referring next to FIG. 4b, the signal line 92 (from FIG. 4a) is the input to de-glitch circuitry A (labeled 96). The function of de-glitch circuitry 96 is to discriminate between switching transients present on the line 92 and signals on the line 92 which indicate that decoder 50 has detected the presence of its predefined address on the bus 24. Switching transients may be produced on the lines 92 and 94 as undesirable and inadvertent noise during the time that transitions on the various address lines of the bus 24 are occurring. The decoders 50 and 52 may respond to the transitions on the address lines of the bus 24 by turning the transistors 48 and 72 off for short periods of time even though no segment selection signals have been sent from the computer 14.

De-glitch circuitry B (labeled 98) is similar in construction to de-glitch circuitry 96. De-glitch circuitry 98 has an input connected to the line 94 in order to discriminate between switching transients on the line 94 and indications by the decoder 52 that its corresponding segment selection address (which was predefined) has been detected on the bus 24. The function of both de-glitch circuitry 96 and 98 is to prevent an inadvertent selection of memory segment 26 or 28. That is, when memory segment 28 has been selected, de-glitch circuitry 96 prevents glitches or signal transients from causing memory segment 26 to be inadvertently selected. Also, when memory segment 26 has been selected, de-glitch circuitry 98 prevents glitches or signal transients from causing memory segment 28 to be inadvertently selected.

De-glitch circuitry 96 and 98 are supplied with a stable reference voltage (preferably +2 volts) on the line 100 and produce output signals on the lines 102 and 104, respectively.

De-glitch circuitry 96 includes depletion mode field effect transistors 106 and 108, and enhancement mode field effect transistor 110. The source of transistor 106 is connected to the line 100. The gate and drain of transistor 106 are connected together to the line 102. The gate of transistor 108 is connected to the line 102. The source and drain of transistor 108 are connected together to ground. The source of transistor 110 is connected to the line 102. The drain of transistor 110 is connected to ground. The gate of transistor 110 is connected to the line 92.

The de-glitch circuitry 96 is shown as it would be constructed using n-channel metal oxide semiconductor (NMOSFET) fabrication techniques. It is possible that an equivalent circuit could be constructed using alternative fabrication techniques.

When the voltage on the line 92 is high (i.e., +5 volts), transistor 110 is turned on and transistor 106 is turned off. The line 92 is normally held in a high state unless the decoder 50 detects that its corresponding predefined address has been placed on the bus 24. The line 92 makes a transition to a low level (ground potential) when the decoder 50 detects its corresponding predefined address on the bus 24, or when switching transients or noise appear on the line 92. When the line 92 makes a transition to a low level, transistor 110 turns off and charge is transferred through the channel (conduction path) of transistor 106 in order to charge the capacitance between the gate and channel of transistor 108.

In the circuit 96, the transistor 108 behaves as a capacitor and the transistor 106 behaves as a resistor. The transistor 110 behaves as a switch for initiating the charging of the capacitance of transistor 108 when the signal on the line 92 makes a high to low transition. As the capacitance of transistor 108 charges up, the voltage on the line 102 increases with a time constant equal to the product of the effective resistance of transistor 106 and the effective capacitance of transistor 108. When the voltage on the line 92 subsequently makes a transition from low to high, the charge stored in the capacitance of transistor 108 is discharged through the channel of transistor 110 and the voltage on line 102 decreases.

The de-glitch circuitry 98 includes transistors 112, 114, and 116 which operate analogously to the transistors 106, 108, and 110.

A reference voltage $V_s$ is provided on the line 100 by the voltage reference supply 118. The voltage on the line 100 is preferably approximately two volts. The construction and operation of the voltage reference supply is described in U.S. Pat. No. 4,390,833, issued June 28, 1983, and entitled "VOLTAGE REGULATOR CIRCUIT", which lists C-P Jeremy Tzeng as inventor and which was assigned to Rockwell International Corporation. The function of the voltage reference supply 118 is to supply a voltage on the line 100 which is stable and substantially independent of processing variations which may occur during the fabrication of the reference supply 118 circuitry.

Sense amplifier A (labeled 120) has its input connected to the line 102 and produces an output on the line 122. The function of sense amplifier 120 is to act as a precision inverter with a switching voltage ($V_{sw}$) preferably equal to one half the reference voltage on the line 100, so that in this preferred embodiment $V_{sw}$ would be +1 volt. The sense amplifier 120 switches to produce a high to low transition on the line 122 when the voltage on the line 102 increases to equal the switching voltage ($V_{sw}$). As described in the previously mentioned U.S. Pat. No. 4,390,833, issued June 28, 1983, the sense amplifier 120 is a precision inverter of which the switching point (the switching voltage $V_{sw}$) can be adjusted by sizing the field effect transistors used in fabricating the amplifier 120, and the switching voltage $V_{sw}$ is insensitive to variations in the power supply voltage $V_{cc}$ (+5 volts) which is provided to the cartridge memory 20 from an external source (not shown) which may be located in the computer 14.

A sense amplifier B (labeled 124) is similar in construction to the amplifier 120 and has its input connected to the line 104 and produces an output on the line 126.

The output lines 122 and 126 are connected through inverters 128 and 130, respectively, to inputs of a segment flip-flop 132. The flip-flop 132 is a conventional JK type flip-flop which produces an output on the line 134. The voltage on the line 134 is in a low logic state to select memory segment 26, and is in a high logic state to select memory segment 28. Alternatively, the signal on the line 136 may be used as a ninth bit to augment the eight bit address received over the bus 24 in order to read from a unitary memory with a nine bit address. Such an address augmentation scheme is equivalent to to the segment selection scheme discussed above. An address eight bits long is capable of specifying up to 256 decimal memory locations; whereas, an address nine bits long is capable of specifying up to 512 decimal locations.

Figure 5:
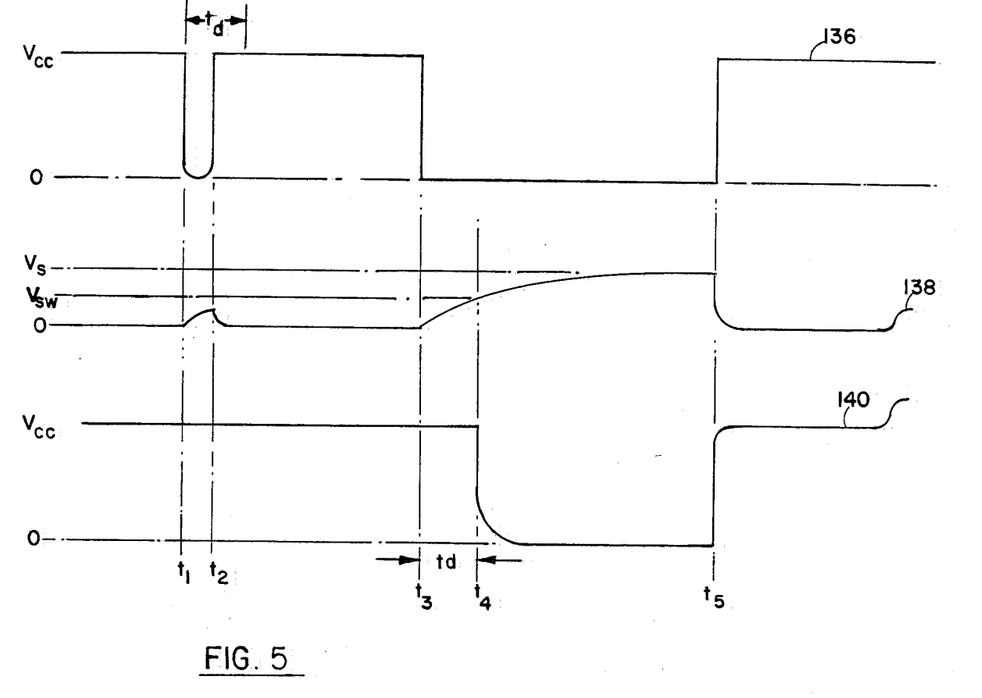
FIG. 5 is a set of voltage versus time waveform diagrams for the memory segment select circuitry of FIGS. 4a and 4b.

Referring next to FIG. 5, voltage versus time waveforms 136, 138, and 140 are shown for the voltages which appear on the lines 92, 102, and 122, respectively. Waveform 136 indicates the presence of a glitch or spurious signal in the time period between $t_1$ and $t_2$. Waveform 136 also shows the detection of a segment select signal during the time period between $t_3$ and $t_5$ by the decoder 50. Note that the glitch at time $t_1$ is of shorter duration than the time $t_d$. The time $t_d$ is defined as the time which is required for charge to build up on the transistor 108 and the voltage on line 102 to equal the sense amplifier 120 switching voltage $V_{sw}$. Note that in waveform 128 at time $t_2$, the voltage magnitude does not reach the switching voltage $V_{sw}$. Waveform 140 shows that the glitch occurring at time $t_1$ has no effect on the output of the sense amplifier 120, and thus the glitch at time $t_1$ does not change the selection of memory segments in the game cartridge 20. The signal on the waveform 136 between the time $t_3$ and $t_5$ is produced by the segment select decoder 50 in response to a segment select signal on the bus 24. Note that the time between $t_3$ and $t_5$ is of much greater duration than the time between $t_1$ and $t_2$. The waveform 138 indicates the charging up of the capacitance in the transistor 108 during the time between $t_3$ and $t_5$. During the time between $t_3$ and $t_5$, the voltage on the line 102 (waveform 138) increases from zero to approach the voltage $V_s$ (the voltage on the line 100). At a time $t_4$ between the times $t_3$ and $t_5$, the voltage on the line 102 (waveform 138) passes through the voltage $V_{sw}$ which is the switching point voltage for the sense amplifier 120. The time duration between the time $t_3$ and $t_4$ is equal to the discrimination time $t_d$. The time $t_d$ is the discrimination time which is characteristic of the de-glitch circuit 96 and which depends upon the effective resistance of the transistor 106 and the effective capacitance of the transistor 108. The time $t_d$ also depends upon the relative sizes of the voltages $V_s$ and $V_{sw}$.

As is shown in waveform 140, the sense amplifier 120 produces an output indication on the line 122 during the time between $t_4$ and $t_5$ in response to the signal on line 102.

The de-glitch circuit 96 and sense amplifier 120 work together in order to selectively eliminate signals having a duration less than the discrimination time ($t_d$) by not passing the signals through to the segment flip-flop 132, as is illustrated by the elimination of the glitch occurring at the time $t_1$. Note that the time duration of the glitch occurring between the time $t_1$ and $t_2$ is less than the discrimination time, $t_d$. The time duration $t_d$ is marked above the waveform 136 starting at time $t_1$ to illustrate that the glitch at $t_1$ is of shorter duration than the discrimination time $t_d$. The de-glitch circuit 96 and sense amplifier 120 act together to selectively pass signals which are longer in duration than the discrimination time $t_d$, as is the case for the signal occurring between the time $t_3$ and $t_5$, as illustrated in waveform 136. The circuits 96 and 120 allow the signal between times $t_3$ and $t_5$ to pass through and be provided to the flip-flop 132, but delay the onset of the signal from $t_3$ to a time $t_4$ which is delayed by the discrimination time $t_d$. Therefore, the circuits 96 and 120 act together to selectively suppress glitches or switching transients which are shorter in time duration than the discrimination $t_d$.

The description above relating to FIG. 5 may also be applied to describe the operation of de-glitch circuitry 98 and sense amplifier 124. The de-glitch circuitry 98 and sense amplifier 124 are preferably identical in construction to the de-glitch circuitry 96 and sense amplifier 120, respectively.

Figure 6:
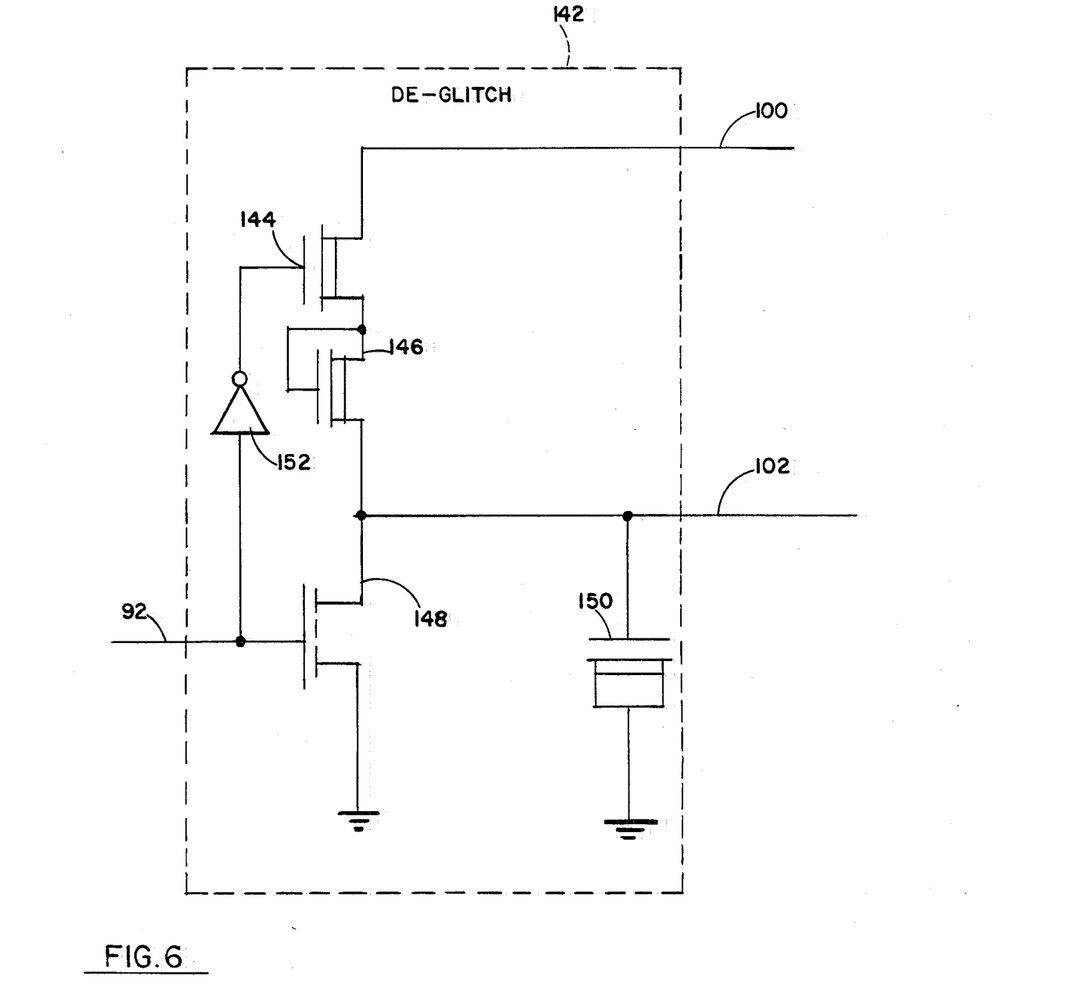
FIG. 6 is an electrical schematic diagram for an alternative embodiment of the de-glitch circuit shown in FIG. 4b.

Referring next to FIG. 6, de-glitch circuitry 142 is an alternative embodiment intended to perform the same function as de-glitch circuit 96 or 98 shown in FIG. 4b. The circuitry 142 includes depletion MOSFET transistors 144, 146, and 150, enhancement MOSFET transistor 148, and inverter 152. It is preferable that the circuitry 142 be fabricated using n-channel devices.

The source of transistor 144 is connected to the line 100, and the drain of transistor 144 is connected to the source and gate of transistor 146. The gate of transistor 144 is connected to the output of inverter 152, and the input of inverter 152 is connected to the line 92 and the gate of transistor 148. The drain of transistor 146 is connected to the source of transistor 148, the gate of transistor 150, and the line 102. The drain of transistor 148 and both the source and drain of transistor 150 are connected to ground.

The transistor 150 acts as a capacitor and performs a function analogous to transistors 108 or 114 in FIG. 4b. Transistors 144 and 148 act as switches, and the transistor 146 acts as a resistor. When the voltage on the line 92 makes a transition from high to low, transistor 148 turns off, transistor 144 turns on and the capacitance of transistor 150 begins to charge up with current flowing from the line 100 through the resistance of transistor 146.

When the voltage on the line 92 makes a transition from low to high, transistor 148 turns on, transistor 144 turns off, and the charge on the capacitance of transistor 150 discharges through the transistor 148.

The waveforms shown in FIG. 5 also describe the performance of the de-glitch circuitry 142 of FIG. 6. The discrimination time, $t_d$, for the circuitry of FIG. 6 depends upon the effective resistance of the transistor 146 and the effective capacitance of the transistor 150.

The following equations express the relationship between the discrimination time ($t_d$) and the various fabrication parameters.

| | |
|---|---|
| $I_{ds6}$ | = drain to source voltage for transistor 146 |
| $\mu$ | = mobility |
| $C_o$ | = gate oxide capacitance per unit area |
| $W_r$ | = channel width for transistor 146 |
| $L_r$ | = channel length for transistor 146 |
| $V_{gs6}$ | = gate to source voltage for transistor 146 |
| $V_{t6}$ | = threshold voltage for transistor 146 |
| $V_{ds6}$ | = drain to source voltage for transistor 146 |
| R | = effective resistance of transistor 146 |
| C | = effective capacitance of transistor 150 |
| $W_c$ | = channel width of transistor 150 |
| $L_c$ | = channel length of transistor 150 |

-continued $$I_{ds6} = 2\mu C_o \frac{W_r}{L_r}\left(V_{gs6} - V_{t6} - \frac{V_{ds6}}{2}\right) V_{ds6}$$

$$\frac{1}{R} = \frac{I_{ds6}}{V_{ds6}}$$

$$C = W_c L_c C_o$$

As a first order of approximation:

$$\frac{1}{R} = 2\mu C_o \frac{W_r}{L_r}\left(\frac{V_{gs6}}{2} - V_{t6}\right)$$

$$RC = \frac{W_c L_c C_o}{2\mu C_o \dfrac{W_r}{L_r}\left(\dfrac{V_{gs6}}{2} - V_{t6}\right)}$$

If a choice is made to make $W_c = W_r$:

$$RC = \frac{L_c L_r}{2\mu\left(\dfrac{V_{gs6}}{2} - V_{t6}\right)}$$

Note also that:

$$t_d = RC \ln \frac{(V_s)}{V_{sw}}$$

Figure 7:
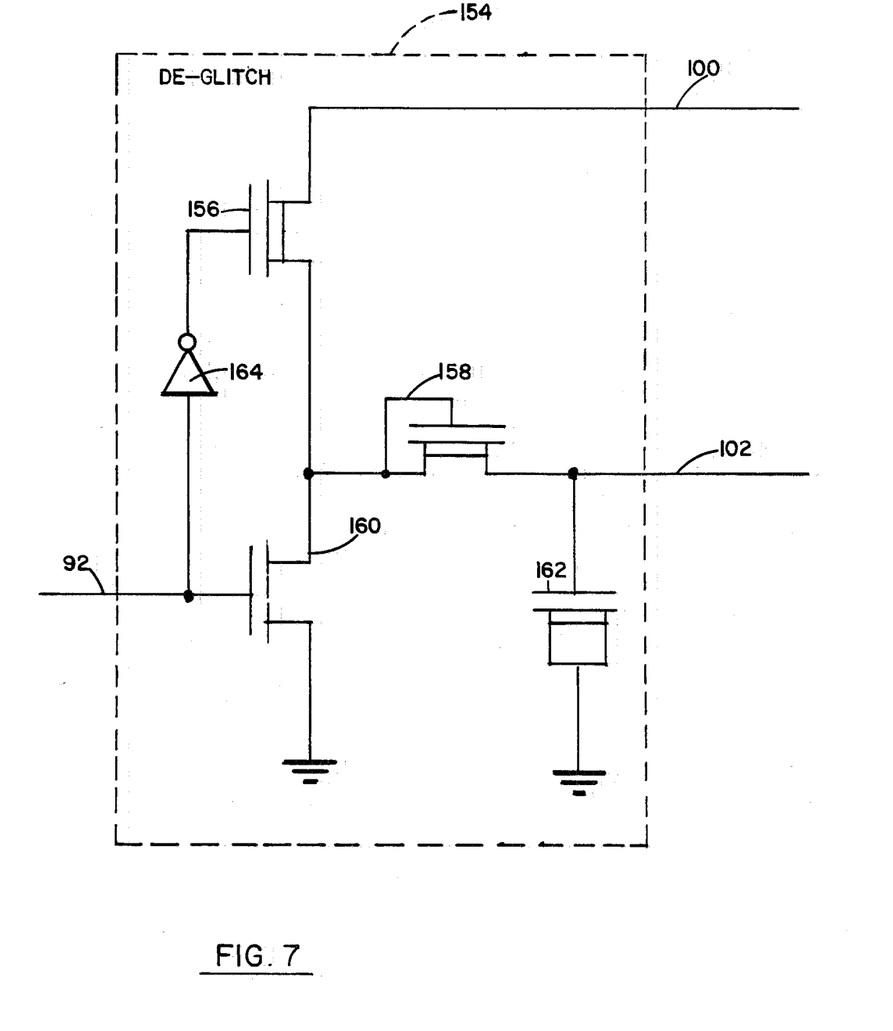
FIG. 7 is an electrical schematic diagram for a further alternative embodiment of the de-glitch circuit shown in FIG. 4b.

Therefore, the only variation to be expected in the discrimination time ($t_d$) is the variation introduced by the RC time constant shown above. Because of the design of the voltage reference supply 118 and sense amplifier 120, no substantial variations in $V_s$ or $V_{sw}$ are expected due to variations in the fabrication process parameters. Therefore, variations in the RC time constant due to fabrication process parameters are limited to variations in the mobility, the depletion threshold voltage $V_{t6}$, and the transistor channel lengths $L_r$ and $L_c$. Referring next to FIG. 7, the de-glitch circuitry 154 is a further alternative embodiment for the circuitry 96 or 98 shown in FIG. 4b. The de-glitch circuitry 154 includes depletion MOSFET transistors 156, 158, and 162, enhancement MOSFET transistor 160, and inverter 164.

The source of transistor 156 is connected to the line 100, and the drain of transistor 156 is connected to the gate and source of transistor 158 and the source of transistor 160. Inverter 164 has its output connected to the gate of transistor 156, and has its input connected to the line 92 and the gate of transistor 160. The drain of transistor 158 is connected to the line 102 and the gate of transistor 162. The drain of transistor 160, and the source and drain of transistor 162 are connected to ground.

The transistor 162 behaves as a capacitor and acts analogously to the transistor 108 or transistor 114 shown in FIG. 4b. Transistors 156 and 160 act as switches, and transistor 158 behaves as a resistor.

When the voltage on line 92 makes a transition from high to low, transistor 160 turns off and transistor 156 turns on, thus allowing the capacitance of transistor 162 to charge up through the resistance of transistor 158 from the voltage on line 100. When the voltage on the line 92 makes a transition from low to high, transistor 160 turns on and transistor 156 turns off, thus allowing the capacitance of transistor 162 to discharge through the resistance of transistor 158 and through the transistor 160.

Figure 8:
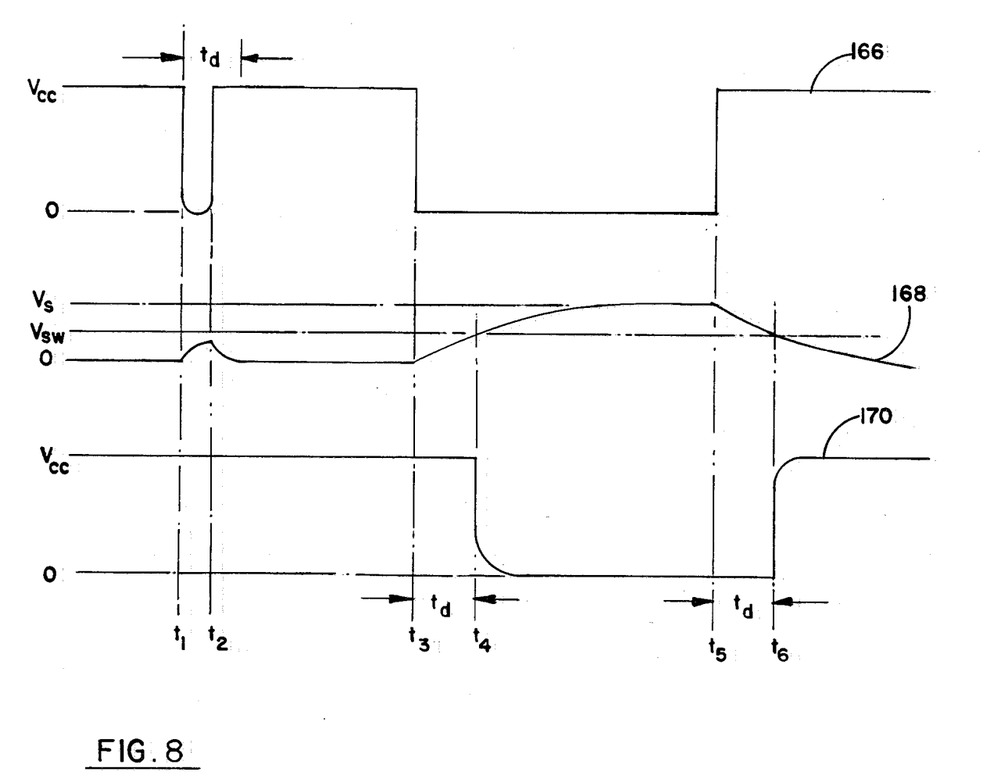
FIG. 8 is a set of voltage versus time waveform diagrams for the circuitry of FIG. 7.

Referring next to FIG. 8, the waveforms 166, 168, and 170 correspond to the voltages present on the lines 92, 102, and 122 (see FIG. 4b) when the de-glitch circuitry 154 (see FIG. 7) is used in place of the de-glitch circuitry 96 of FIG. 4b. The de-glitch circuitry 154 discriminates against glitches or switching transients having a shorter duration than the discrimination time $t_d$, such as the glitch occurring between the times $t_1$ and $t_2$. The waveform 166 indicates a segment select signal between the times $t_3$ and $t_5$ as in the case in FIG. 5. The waveform for the voltage on line 122 (as shown in waveforms 140 and 170) makes a transition from high to low at a time $t_4$ which is delayed by the discrimination time ($t_d$) from the time $t_3$. Note that in FIG. 5, the waveform 150 makes a transition from low to high at the time $t_5$. However, the transition from low to high for waveform 170 in FIG. 8 is delayed until time $t_6$ which is delayed by the discrimination time ($t_d$) from the time $t_5$. The delay between the time $t_5$ and $t_6$ is due to the discharging of the capacitance of transistor 162 through the resistance of transistor 158 during the time that the transistor 160 is turned on.

If the switching voltage ($V_{sw}$) is equal to half of the reference voltage ($V_s$) then the time duration of the signal on the waveform 170 between the time $t_4$ and $t_6$ will be equal to the time duration of the signal (corresponding to the segment select signal) on the waveform 166 between the time $t_3$ and $t_4$.

Although the invention has been described and illustrated in detail, it is clearly understood that the same is by way of illustration and example only and is not to be taken by way of limitation, the spirit and scope of this invention being limited only by the terms of the appended claims.

What is claimed is:

1. In a video game cartridge having first and second memory segments with an address segment select line, and a flip-flop coupled to said line for selecting between the segments, with set and reset inputs to said flip-flop for changing the state of the flip-flop, the cartridge having a common signal bus for addressing both the segments, and the cartridge having decoder circuitry for providing first and second segment select pulse signals in response to reception of predefined first and second segment select words on said bus, wherein the improvement comprises:

a first de-glitch circuit responsive to said first segment select signal, for producing a ramp de-glitch output signal which increases in amplitude during said first segment select pulse signal;

a first sense amplifier responsive to said first de-glitch output signal, for producing a first sense amplifier output signal on said set input to the flip-flop when said first de-glitch output signal exceeds a first predefined threshold switching level, so that said first sense amplifier output signal is provided only when said first segment select word has been present on said bus for a time duration greater than a first predefined signal duration;

a second de-glitch circuit responsive to said second segment select signal, for producing a second ramp de-glitch output signal which increases in amplitude during said second segment select pulse signal; and a second sense amplifier responsive to said second de-glitch output signal, for producing a second sense amplifier output signal when said second de-glitch output signal exceeds a second predefined threshold switching level, so that said second sense amplifier output signal is produced only when said second segment select word has been present on said bus for a time duration greater than a second predefined signal duration.

2. A control circuit having an input and an output, for providing a digital output signal on said output in response to a digital input signal having a duration greater than a predefined signal duration on said input, said control circuit comprising:

a de-glitch circuit having an input coupled to said control circuit input and having an output, said de-glitch circuit comprising:

a first field effect transistor connected as a resistance and having means connecting its source to a first reference voltage and its drain connected to said de-glitch circuit output;

a second field effect transistor having its gate connected to said de-glitch circuit output and its source and drain connected to a second reference voltage; and a third field effect transistor having its gate connected to said de-glitch circuit input, its source connected to said de-glitch circuit output and its drain connected to said second reference voltage; and a sense circuit having an input coupled to said de-glitch circuit output and having an output coupled to said control circuit output, for producing said digital output signal when the signal on said de-glitch circuit output exceeds a predefined switching signal level.

3. The control circuit of claim 2 wherein the gate and drain of said first field effect transistor are coupled together.

4. The control circuit of claim 3 wherein:
said first field effect transistor is a depletion mode MOSFET;
said second field effect transistor is a depletion mode MOSFET; and
said third field effect transistor is an enhancement mode MOSFET.

5. The control circuit of claim 2 wherein said connecting means comprises a fourth field effect transistor connected between said first field effect transistor and said first reference voltage, wherein the drain of said fourth field effect transistor is coupled to the source of said first field effect transistor and the source of said fourth field effect transistor is coupled to said first reference voltage.

6. The control circuit of claim 5 wherein:
said first field effect transistor is a depletion MOSFET;
said second field effect transistor is a depletion MOSFET;
said third field effect transistor is an enhancement MOSFET; and
said fourth field effect transistor is a depletion MOSFET.

7. The control circuit of claim 5 wherein the gate and source of said first field effect transistor are connected together.

8. The control circuit of claim 7 wherein an inverter is coupled between said de-glitch circuit input and the gate of said fourth field effect transistor.

9. A control circuit having an input and an output, for producing a digital output signal on said output in response to a digital input signal having a duration greater than a predefined signal duration on said input, said control circuit comprising:

a de-glitch circuit having an input coupled to said control circuit input and having an output, said de-glitch circuit comprising:

a first field effect transistor connected as a resistance and having means connecting its source to a first refeence voltage and its drain connected to said de-glitch circuit output;

a second field effect transistor having its gate connected to said de-glitch circuit output and its source and drain connected to a second reference voltage; and a third field effect transistor having its gate connected to said de-glitch circuit input, its source coupled to the source of said first field effect transistor and its drain coupled to said second reference voltage; and a sense circuit having an input coupled to said de-glitch circuit output and having an output coupled to said control circuit output, for producing said digital output signal when the signal on said de-glitch circuit output exceeds a predefined switching signal level.

10. The control circuit of claim 9 wherein the gate and source of said first field effect transistor are coupled together.

11. The control circuit of claim 10 wherein said connecting means comprises a fourth field effect transistor connected between said first reference voltage and said first and third field effect transistors, said fourth field effect transistor having its source coupled to said first reference voltage and its drain coupled to the source of said first field effect transistor and to the source of said third field effect transistor.

12. The control circuit of claim 11 wherein the gate of said fourth field effect transistor includes means connecting its gate to said de-glitch circuit input.

13. The control circuit of claim 12 wherein:
said first field effect transistor is a depletion MOSFET;
said second field effect transistor is a depletion MOSFET;
said third field effect transistor is an enhancement MOSFET; and
said fourth field effect transistor is a depletion MOSFET.

14. The control circuit of claim 13 wherein said gate connecting means comprises an inverter connected between said de-glitch circuit input and the gate of said fourth field effect transistor.

* * * * *